United States Patent [19]
Liwinski

[11] Patent Number: 5,424,676
[45] Date of Patent: Jun. 13, 1995

[54] TRANSISTOR COLLECTOR STRUCTURE FOR IMPROVED MATCHING AND CHOKELESS POWER SUPPLY CONNECTION

[75] Inventor: Henry Z. Liwinski, North Wales, Pa.

[73] Assignee: SGS-Thomson Microelectronics, Inc., Carrollton, Tex.

[21] Appl. No.: 11,386

[22] Filed: Jan. 29, 1993

[51] Int. Cl.$^6$ ............................................. H01L 25/00
[52] U.S. Cl. ...................................... 327/565; 327/334; 327/362; 327/481; 257/705
[58] Field of Search ................... 307/299.3, 303, 303.1, 307/490, 491; 257/584, 705; 327/334, 362, 481, 564, 565

[56] References Cited

U.S. PATENT DOCUMENTS

| | | | |
|---|---|---|---|
| 3,566,212 | 2/1971 | Marx | 257/705 |
| 4,119,997 | 10/1978 | Fulkerson | 307/303.1 |
| 4,376,287 | 3/1983 | Sechi | 257/705 |
| 4,525,638 | 6/1985 | Gray | 307/299.3 |
| 4,763,016 | 8/1988 | Chieli | 307/299.3 |
| 4,849,656 | 7/1989 | Neidorff | 307/299.3 |

Primary Examiner—Terry D. Cunningham
Attorney, Agent, or Firm—Renee M. Larson; Lisa K. Jorgenson; Richard K. Robinson

[57] ABSTRACT

Internal to the transistor, an additional, direct connection is made from the internal collector to the external collector of the transistor by a fixed shunt inductance. The external power supply $V_s$ is applied to the transistor collector through an adjustable external shunt element. The adjustable external shunt element allows the user to finetune the impedance matching circuit such that the transformation ratio of the output matching circuitry is minimized.

13 Claims, 1 Drawing Sheet

TRANSISTOR COLLECTOR STRUCTURE FOR IMPROVED MATCHING AND CHOKELESS POWER SUPPLY CONNECTION

BACKGROUND OF THE INVENTION

1. Field of the Invention

The present invention relates generally to transistors, and more specifically to a transistor collector structure for improved matching and power supply connection.

2. Description of the Prior Art

Throughout the history of transistor design, the power supply has been applied to a transistor collector by a variety of means, depending on the particular circuit application and frequency of operation desired. Common means for supplying power to the transistor collector have included an RF choke, a section of transmission line, and an inductance of a resonance circuit.

In the case where a transmission line or RF choke is used, their parameters must be chosen carefully, usually resulting in compromise. For in-band frequencies, the transmission line or RF choke should not load the collector or throw the transistor into oscillations. For out-of-band frequencies, the transistor must remain stable. In broadband applications, these requirements become even more critical and difficult to achieve. The use of an RF choke can adversely affect achievement of these design goals. For instance, at low frequencies where power gain is high, the inductance represented by the RF choke may contribute to circuit instability.

In addition to transistor stability, matching between the load internal to the transistor and the external load, usually 50 ohms, is an important design consideration. A fixed shunt inductance, typically internal to the transistor, is commonly used in transistor power designs as part of the transistor output matching circuit. It provides the benefit of tuning out the effective output capacitance of the transistor, thereby decreasing the transformation ratio required of matching circuitry and increasing transistor efficiency.

Since the value of the fixed shunt inductance is normally predetermined before the transistor is fabricated, it may be that this value is not optimal for a given transistor application. Therefore, the predetermined shunt inductance provides the designer very little flexibility.

SUMMARY OF THE INVENTION

It would be advantageous in the art to utilize a transistor design which eliminates the need for a power supply choke in transistor circuits, thereby contributing to transistor stability.

It would furthermore be advantageous in the art to utilize a transistor which enables full control over transistor output matching circuitry.

Internal to the transistor, an additional, direct connection is made from the internal collector to the external collector of the transistor by a fixed shunt inductance. The external power supply $V_s$ is applied to the transistor collector through an adjustable external shunt element. The adjustable external shunt element allows the user to finetune the impedance matching circuit such that the transformation ratio of the output matching circuitry is minimized.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
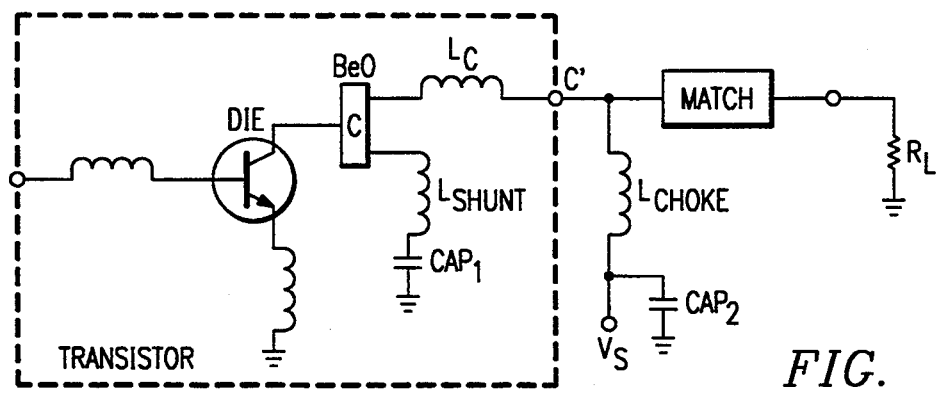
FIG. 1 is a bipolar power transistor with output circuitry according to the prior art.

FIG. 1 shows a bipolar npn power transistor with output circuit according to the prior art. The common emitter transistor shown typically has a die transistor which rests on a conductively plated highly heat conductive insulator such as Beryllium Oxide, separating the transistor collector from the heat sink, the case of the device. Because the bottom of the die is a collector, the top of the BeO is also a collector, here noted as internal collector C. External collector C′ represents the collector external to the transistor, commonly, the collector lead, outside the packaged transistor. As is well known in the art, the top of the BeO or other insulator which separates the transistor collector from the heat sink of the device, is plated with a conductor, such as gold, such that electrical conductivity may be achieved. Also, the plated conductor is necessary in order to facilitate electrical connections through soldering or otherwise connecting bonding wire. The bottom of the die, which is a collector, actually rests on this plating.

Internal collector C is connected to external collector C′ by collector bonding wire and transmission line inductance $L_c$. Also, internal collector C is connected through shunt inductance $L_{SHUNT}$ and bypass capacitor $CAP_1$ to ground, inside the transistor package. The emitter of transistor T is wire bonded to ground potential. External collector C′ is connected through MATCH to $R_L$ load which is typically 50 ohms; MATCH circuitry provides impedance adjustment external to transistor T. $L_c$, MATCH, and $L_{SHUNT}$, together, form the matching network required to address the impedance mismatch between the required internal transistor load and $R_L$, the external load. Power supply, $V_s$, is applied to the transistor collector through RF choke, $L_{CHOKE}$, and is bypassed by $CAP_2$.

$L_{CHOKE}$ represents the inductance of the RF choke or transmissions line by which power supply $V_s$ is applied to the collector of the transistor. For simplicity, it is assumed that the RF choke represents an ideal choke. However, the presence of even an ideal RF choke may affect transistor stability, especially at low frequencies where bipolar transistor gain is high. RF choke inductance may form resonant circuits with adjacent circuit capacitors at various frequencies.

Figure 2:
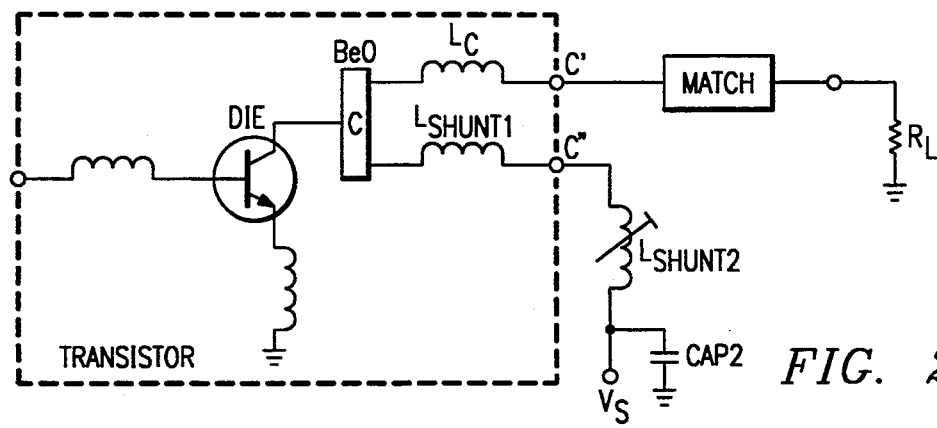
FIG. 2 is a bipolar power transistor with output circuitry according to the present invention.

FIG. 2 is a transistor circuit schematic according to the present invention. The schematic is similar to the schematic shown in FIG. 1, except that $L_{CHOKE}$ is absent and there is a second separate external collector, C″. Internal collector C is seated on an insulator such as Beryllium Oxide (BeO) and is connected to external collector C″ by $L_{SHUNT1}$. Both $L_c$ and $L_{SHUNT1}$ are internal to the transistor as indicated by the dashed lines shown in FIG. 2. Power supply $V_s$ is applied through externally adjustable shunt element $L_{SHUNT2}$, external collector C''', and internal shunt element $L_{SHUNT1}$. Capacitor $CAP_2$ is a bypass capacitor.

Together, $L_c$, $L_{SHUNT1}$, $L_{SHUNT2}$, and MATCH make up the matching circuit which is responsible for transforming the impedance of external load $R_L$ so that at internal collector C, the transistor sees the proper impedance necessary to develop required power at certain frequencies and efficiencies.

The invention shown in FIG. 2 provides an additional, direct connection through $L_{SHUNT1}$ from external collector C'' to internal collector C. This connection allows for elimination of the RF choke of FIG. 1 if shunt inductance is used as a first matching element. $L_{CHOKE}$ might be a cause of circuit instability and/or effect impedance matching capabilities, so the removal of $L_{CHOKE}$ is a benefit. $L_c$, $L_{SHUNT1} + L_{SHUNT2}$ and MATCH together form the impedance matching circuitry. Since $L_{SHUNT2}$ is adjustable, it may be used to fine-tune the impedance matching circuit.

The transistor shown in FIG. 2 is for a transistor die or a group of dice with a relatively short collector area. For transistors with electrically longer collectors, such as several dice in parallel, the use of two or more shunts is a better choice and assures more equal participation of all dice in power generation. An implementation of multiple adjustable shunts is more practical for a hybrid transistor than for a packaged transistor.

Figure 3:
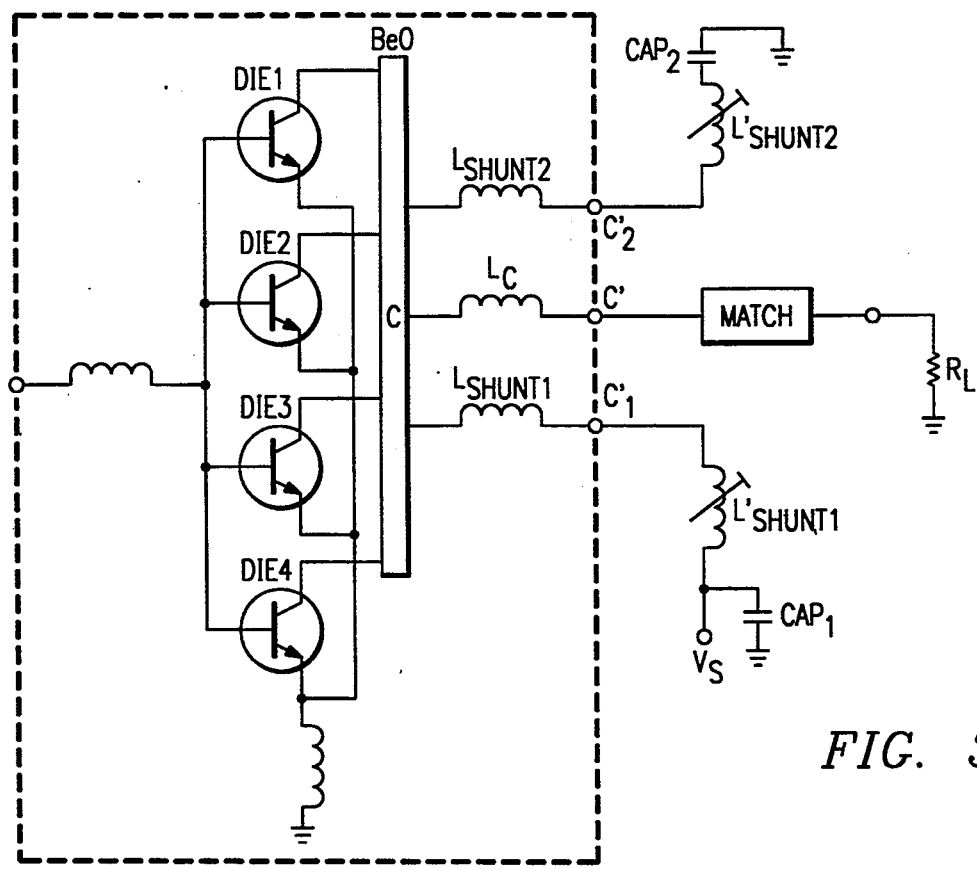
FIG. 3 is a bipolar power transistor with output circuitry according to an alternate embodiment of the present invention.

FIG. 3 shows a common-emitter, four die transistor, with two adjustable shunts. The internal collector C, which rests on top of an insulator such as Beryllium Oxide (BeO), is connected to external collector C' by bonding wires and transmission line inductance $L_c$. Likewise, internal collector C is connected to external collectors $C_1'$ and $C_2'$ through the combination of bondwires and transmission line inductances $L_{SHUNT1}$ and $L_{SHUNT2}$, respectively. $CAP_1$ serves as a bypassing capacitor; $CAP_2$ is a decoupling capacitor. $L'_{SHUNT1}$ and $L'_{SHUNT2}$ provide adjustable shunt matching capability. Together, $L_c$, $L_{SHUNT1}$, $L_{SHUNT2}$, $L'_{SHUNT1}$, $L_{SHUNT2}$, and MATCH make up the transistor output matching circuitry.

The alternate preferred embodiment of the invention shown in FIG. 3 provides additional, direct connections from the external collector to the internal collector of a transistor. Such direct connections allow the RF choke of the prior art, with its inherent difficulties, to be eliminated. The $L_{CHOKE}$ of FIG. 1 is often the cause of circuit instability and/or effect impedance matching problems. Without this RF choke inductance, transistor stability, especially at low frequencies where gain is high, may be improved.

Also, the described invention enables greater flexibility in matching the internal load of a transistor with the external load $R_L$ through externally adjustable shunt elements, such as $L'_{SHUNT1}$ and $L'_{SHUNT2}$ shown in FIG. 3. Together, $L_c$, $L_{SHUNT1}$, $L'_{SHUNT1}$, $L_{SHUNT2}$, $L'_{SHUNT2}$, and MATCH comprise the output matching circuitry for the transistor and transforms the impedance of external load $R_L$ so that the transistor sees the proper impedance to develop required power at required frequencies and efficiencies.

While the invention has been particularly shown and described with reference to two preferred embodiments, it will be understood by those skilled in the art that various changes in form and detail may be made therein without departing from the spirit and scope of the invention. For instance, while a bipolar NPN transistor has been described for ease of explanation, those skilled in the art will recognize that the invention may be utilized in a wide variety of transistor types. A PNP transistor, as well as GaAsFET and MOSFET transistors, could successfully embody the invention. Additionally, BeO is the heat conductive material described in the preferred embodiment, but one of skill in the art will realize that other materials, such as Aluminum, may also be used without departing from the spirit and scope of the invention.

What is claimed is:

1. Transistor output matching circuitry, comprising:
    a transistor, housed in a transistor package, having an emitter, a base, a first collector, wherein the base is connected to an input terminal of the transistor package, the emitter is connected to a predetermined voltage level;
    a second collector, internal to the transistor package, electrically connected to the first collector;
    a third collector, external to the transistor package and coupled to the second collector;
    a fourth collector, external to the transistor package and coupled to the second collector;
    external matching circuitry which connects the third collector to a load external to the transistor package; and
    an adjustable external shunt element which connects the fourth collector to an external power supply.

2. The output matching circuitry of claim 1, wherein the second collector is connected to the third collector by transmission line inductance.

3. The output matching circuitry of claim 1, wherein the second collector is connected to the fourth collector by a fixed shunt inductance element.

4. The output matching circuitry of claim 1, wherein the second collector rests on conductively plated heat conductive material.

5. The output matching circuitry of claim 4, wherein the heat conductive material is Beryllium Oxide (BeO).

6. The output matching circuitry of claim 1, wherein the transistor is common-emitter configured.

7. Transistor output matching circuitry, comprising:
    a plurality of transistor die, each having a collector, an emitter, and a base, housed in a transistor package, wherein the base of each transistor die is connected to an input terminal and the emitter of each transistor die is connected to a first predetermined voltage level;
    an internal collector structure, internal to the transistor package, which is connected to the collector of each transistor die;
    external matching circuitry which connects a first external collector structure to a load external to the transistor package, wherein the first external collector structure is connected to the internal collector structure by a first fixed shunt inductance element; and
    a first adjustable external shunt element which connects a second external collector structure to a second predetermined voltage level, wherein the second external collector structure is connected to the internal collector structure by a second fixed shunt inductance element.

8. The output matching circuitry of claim 7, wherein the first fixed shunt inductance element comprises a transmission line inductance.

9. The output matching circuitry of claim 7, wherein the internal collector structure is connected to a third external collector structure by a third fixed shunt inductance element, wherein the third external collector structure is connected to the second predetermined voltage level by a second adjustable external shunt element.

10. The output matching circuitry of claim 7, wherein the second predetermined voltage level is a supply voltage.

11. The output matching circuitry of claim 7, wherein the internal collector structure rests on conductively plated heat conductive material.

12. The output matching circuitry of claim 11, wherein the heat conductive material is Beryllium Oxide (BeO).

13. The output matching circuitry of claim 7, wherein the first predetermined voltage level is ground.

* * * * *